US006459254B1

(12) United States Patent
Mazzochette et al.

(10) Patent No.: US 6,459,254 B1
(45) Date of Patent: Oct. 1, 2002

(54) POWER SENSING RF TERMINATION APPARATUS INCLUDING TEMPERATURE COMPENSATION MEANS

(75) Inventors: Joseph B. Mazzochette, Cherry Hill; Robert Blacka, Pennsauken, both of NJ (US); David Markman, Dresher, PA (US)

(73) Assignee: EMC Technology, Inc., Cherry Hill, NJ (US)

( * ) Notice: Subject to any disclaimer, the term of this patent is extended or adjusted under 35 U.S.C. 154(b) by 0 days.

(21) Appl. No.: 09/670,938

(22) Filed: Sep. 26, 2000

Related U.S. Application Data

(63) Continuation-in-part of application No. 08/866,959, filed on Jun. 3, 1997, now Pat. No. 6,147,481, which is a continuation-in-part of application No. 08/773,391, filed on Dec. 27, 1996, now abandoned.

(51) Int. Cl.$^7$ .............................................. G01R 23/04
(52) U.S. Cl. ........................................ 324/95; 324/105
(58) Field of Search .......................... 324/95, 106, 105; 333/155

(56) References Cited

U.S. PATENT DOCUMENTS 4,414,837 A * 11/1983 Bice et al. ................... 73/1.15

* cited by examiner

Primary Examiner—Michael J. Sherry
Assistant Examiner—Russell M. Kobert
(74) Attorney, Agent, or Firm—Pennie & Edmonds LLP

(57) ABSTRACT

A power sensing RF termination comprising a calibration means allows the user to correct for part-to-part variation, miss match loss and output offset. The power sensing RF termination comprises a first and second temperature sensitive resistors connected at a first common junction, a switching means for connecting either an RF input or a DC power reference to the first common junction, a first switch for connecting either a DC voltage source or a first current detecting resistor to the first temperature sensitive resistor, and a second current detecting resistor connected to the second temperature sensitive resistor. A first output terminal is connected to the junction between the first switch and the first temperature sensitive resistor. A second output terminal is connected to the first common junction. A third output terminal is connected to the junction between the second temperature sensitive resistor and the second current detecting resistor. The first and second temperature sensitive resistors have substantially the same temperature coefficient of resistance; but the first temperature sensitive resistor has a positive temperature coefficient of resistance while the second temperature sensitive resistor has a negative temperature coefficient of resistance. Using the measurements of the voltages at the first, second and third output terminals, a calibration table is formed correlating the power absorbed in the first and second temperature sensitive resistors to the ratio between the voltage drop across either the first or second temperature sensitive resistor and the voltage drop across both the first and second temperature resistive resistors.

10 Claims, 2 Drawing Sheets

POWER SENSING RF TERMINATION APPARATUS INCLUDING TEMPERATURE COMPENSATION MEANS

This is a continuation-in-part of application Ser. No. 08/866,959, filed Jun. 3, 1997, now Pat. No. 6,147,481, which is a continuation-in-part of application Ser. No. 08/773,391, filed Dec. 27, 1996, now abandoned.

FIELD OF THE INVENTION

The present invention is directed to a termination for an RF circuit, and, more particularly, to a termination for an RF circuit which senses changes in power.

BACKGROUND

The detection of RF power is a common requirement for many systems. The presence and level of an RF signal may be used to indicate a failure, a query or a performance metric. Many circuits have been designed that function as power detectors using both active and passive devices. Semiconductor devices such as diodes, have been used to detect power. However, such semiconductor devices have many problems. Among these problems are that the devices are generally not linear, they are temperature sensitive, are subject to being adversely affected by static discharge, have limited frequency range and are generally expensive. Passive devices, such as bolometers and thermocouples, have also been used, but also have many problems. They generally require additional circuitry to provide the determination of the power so that they are expensive. Also, it would be desirable to have a relatively inexpensive device which can determine changes in power of an RF circuit and also will act as a termination for the circuit.

SUMMARY OF THE INVENTION

A power detector for an RF circuit includes an RF input terminal, and first and second temperature sensitive resistors connected in parallel to the input termination so that the temperature sensitive resistors have a common connection to the input terminal. Preferably, the first temperature sensitive resistor has a positive temperature coefficient of resistance and the second temperature sensitive resistor has a negative temperature coefficient of resistance. Output terminals and calibration circuitry are connected to the temperature sensitive resistors.

DETAILED DESCRIPTION

Figure 1:
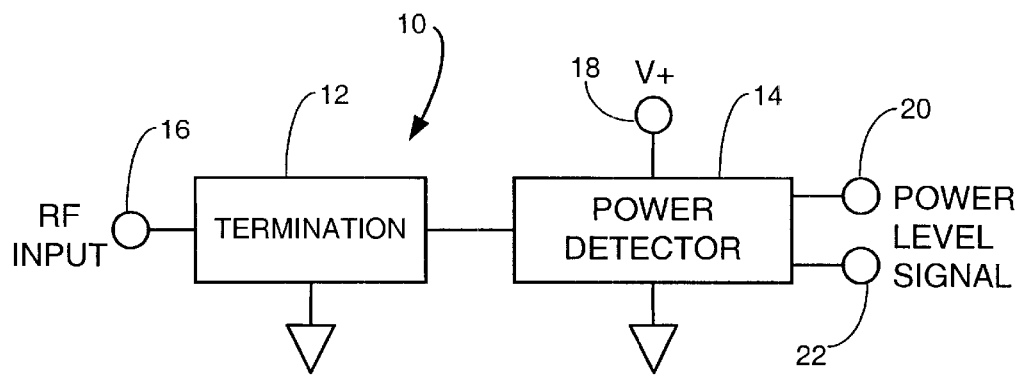
FIG. 1 is a block diagram of a power detector circuit disclosed in the copending '959 application.

Referring initially to FIG. 1, there is shown a block diagram of a power detector circuit that is disclosed in FIG. 1 of the copending '959 applications. Power detector circuit 10 includes a termination portion 12 and a power detector portion 14 connected to the termination portion 12. The circuit 10 includes an RF input terminal 16 which is connected to the termination portion 12 and a DC input terminal 18 connected to the power detector portion 12. The circuit 10 also includes power output terminals 20 and 22 from the power detector portion 12.

Figure 2:
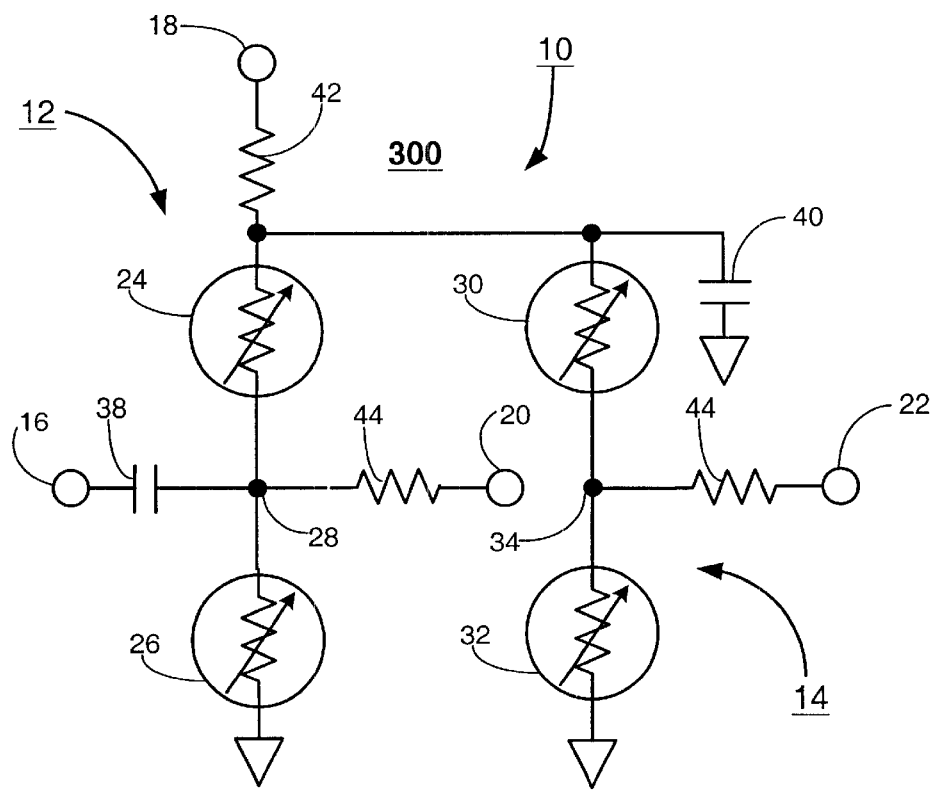
FIG. 2 is a circuit diagram of a circuit disclosed in the copending '959 application.

Referring now to FIG. 2, there is shown a power detector circuit 10 that is disclosed in FIG. 2 of the copending '959 application. The termination portion 12 of the circuit 10 comprises first and second temperature sensitive resistors 24 and 26, such as thermistors, connected in parallel with the RF input terminal 16. Thus, the temperature sensitive resistors 24 and 26 have a common connection 28 to the RF input terminal 16. One of the output terminals 20 is connected to the common junction 28 of the temperature sensitive resistors 24 and 26. The DC input terminal 18 is connected to the first temperature sensitive resistor 24.

Third and fourth temperature sensitive resistors, such as thermistors, 30 and 32 are connected together with a common connection 34. The third temperature sensitive resistor 30 is substantially identical to the first temperature sensitive resistor 24 in that it has the same nominal resistance value, and the same temperature coefficient of resistance as that of the first temperature sensitive resistor 24. The fourth temperature sensitive resistor 32 is substantially identical to the second temperature sensitive resistor 26 in that it has the same nominal resistance value, and the same temperature coefficient of resistance as that of the second temperature sensitive resistor 26. Ambient temperature sensing output terminal 22 is connected to the common junction 34 of the third and fourth temperature sensitive resistors 30 and 32, and the DC input terminal 18 is connected to the third temperature sensitive resistor 30.

A coupling capacitor 38 is connected between the RF input terminal 16 and the common junction 28 of the first and second temperature sensitive resistors 24 and 26. A coupling capacitor 40 is connected to the DC input terminal 18. A dropping resistor 42 is connected between the DC input terminal 18 and the first and third temperature sensitive resistors 24 and 30. A separate isolation resistor 44 is connected between the power sensing output terminal 20 and common junction 28 between the first and second temperature sensitive resistors 24 and 26, and between the ambient temperature sensing terminal 22 and the common junction 34 between the third and fourth temperature sensitive resistors 30 and 32.

In the circuit 10, the first and second temperature sensitive resistors 24 and 26 typically have temperature coefficients of resistance (TCR) that are of the same magnitude but opposite polarity and have a nominal resistance value at room temperature to provide the desired termination resistance for the RF circuit being terminated by the circuit 10. For example, for a 50 ohm termination, each of the first and second temperature sensitive resistors 24 and 26 should have a nominal resistance value of 100 ohms so that their parallel resistance value is 50 ohms.

To the extent that mismatch losses can be tolerated, other resistance values may be advantageous. For example, because the resistance value of a negative temperature coefficient (NTC) thermistors becomes non-linear as it approaches about 40 ohms, it is advantageous to use a NTC thermistors having a higher resistance value than the positive temperature coefficient (PTC) thermistors at room temperature. Thus, improvements in sensitivity and power performance can be obtained using an NTC thermistors with a resistance value of 120 ohms at room temperature and a PTC thermistors with a resistance value of 80 ohms at room temperature. Moreover, while the use of an NTC thermistors and a PTC thermistors is preferred for resistors 24 and 26, the circuit will still detect power even if the TCRs have the same polarity as long as the TCRs are different. For example, the first thermistors may have a TCR of 5000 $\mu m/°$ C. while the second has a TCR of 50 $\mu m/°$ C.

RF power provided at the RF input terminal 16 will cause the first and second temperature sensitive resistors 24 and 26 to heat up. If the first temperature sensitive resistor 24 has a positive temperature coefficient of resistance, the heating of the first temperature sensitive resistor 24 will cause its resistance to increase. If, however, the second temperature sensitive resistor 26 has a negative temperature coefficient of resistance, the heating of the second temperature sensitive resistor 26 causes its resistance to decrease. Preferably, the resistance of the second temperature sensitive resistor 26 decreases the same amount that the resistance of the first temperature sensitive resistor 24 increases. Thus, the parallel resistance value of the first and second temperature sensitive resistors 24 and 26 will remain substantially constant. Therefore, changes in the RF power provided at the RF input terminal 16 will not result in a change in the termination resistance of the termination portion 12 of the circuit 10.

DC power provided at the DC input terminal 18 is isolated from the RF power by the resistors 44 and the coupling capacitors 38 and 40. A DC voltage at the output terminal 20 is dependent on the resistance values of the dropping resistor 42, the first temperature sensitive resistor 24 and the second temperature sensitive resistor 26. If, for example, the RF power at the RF input terminal 16 increases, the first and second temperature sensitive resistors 24 and 26 will be heated further so that their resistance values will change. In particular, the resistance value of a temperature sensitive resistor having a positive temperature coefficient will increase and the resistance value of a temperature sensitive resistor having a negative temperature coefficient of resistance will decrease. Since the voltage at the output terminal 20 is dependent on the resistance values of the first and second temperature sensitive resistors 24 and 26, changes in these resistance values will cause a change in the voltage at the output terminal 20. The change in the voltage will be proportional to the change in the RF power which caused the change in the resistance values of the first and second temperature sensitive resistors. If the RF power decreases, the voltage at the output terminal 20 will similarly change in the opposite direction. Thus, by measuring the voltage at the output terminal 20, changes in the RF power can be determined by changes in the output voltage.

Although changes in the voltage at the output terminal 20 result from changes in the resistance values of the first and second temperature sensitive resistors 24 and 26 as a result of changes in the RF power, the resistance values of the first and second temperature sensitive resistors 24 and 26 will also change as a result of changes in the ambient temperature. To compensate for the changes in the ambient temperature, the third and fourth temperature sensitive resistors 30 and 32 are provided. The resistances of the third and fourth temperature sensitive resistors 30 and 32 are identical to the resistances of the first and second temperature sensitive resistors 24 and 26 respectively, and the same DC current is applied across the third and fourth temperature sensitive resistors 30 and 32 as across the first and second temperature sensitive resistor 24 and 26. However, the third and fourth temperature sensitive resistors 30 and 32 are not coupled to the RF input terminal 16 so that they are not affected by the RF power. Thus, the resistance values of the third and fourth temperature sensitive resistors 30 and 32, and thereby the voltage at the ambient temperature sensing output terminal 22, will vary only as a result of changes in the ambient temperature. Such changes will be identical to the changes caused in the voltage at the output terminal 20 as a result of changes in the resistance values of the first and second temperature sensitive resistors 24 and 26 caused by changes in the ambient temperature. Therefore, by subtracting the voltage at the output terminal 22 from the voltage at the output terminal 20, there is provided a voltage which is directly proportional to the change in the RF power at the input terminal 16. Thus, the circuit 10 provides an output which is directly proportional to the RF input power and indicates any change in the RF input power. However, the termination impedance of the circuit 10 does not change substantially with changes in the RF input power so that there is provided a uniform termination impedance. By using the voltage reference at the ambient temperature sensing output terminal 22 and comparing it to the power output voltage at the output terminal 20, the circuit 10 compensates for variation in ambient temperature that would otherwise cause errors in the power detection.

Although the DC input terminal 18 has been shown as being connected to the first and third temperature sensitive resistors 24 and 30 which have a positive temperature coefficient of resistance, alternatively the DC input terminal 18 can be connected to the second and fourth temperature sensitive resistors 26 and 32 which have the negative temperature coefficient of resistance. In either case, the circuit 10 will operate in the same manner to sense changes in the RF power. Also, the isolation resistors 44 may be replaced by inductors which will achieve the same isolation.

Unfortunately, the accuracy of the circuit of FIG. 2 is limited by part-to-part variations in sensitivity. The low-end dynamic range and sensitivity of the device is further limited due to output offset; and the high-end dynamic range is limited by mismatch losses and nonlinearity in the materials used for the negative temperature coefficient resistors 26, 32.

Figure 3:
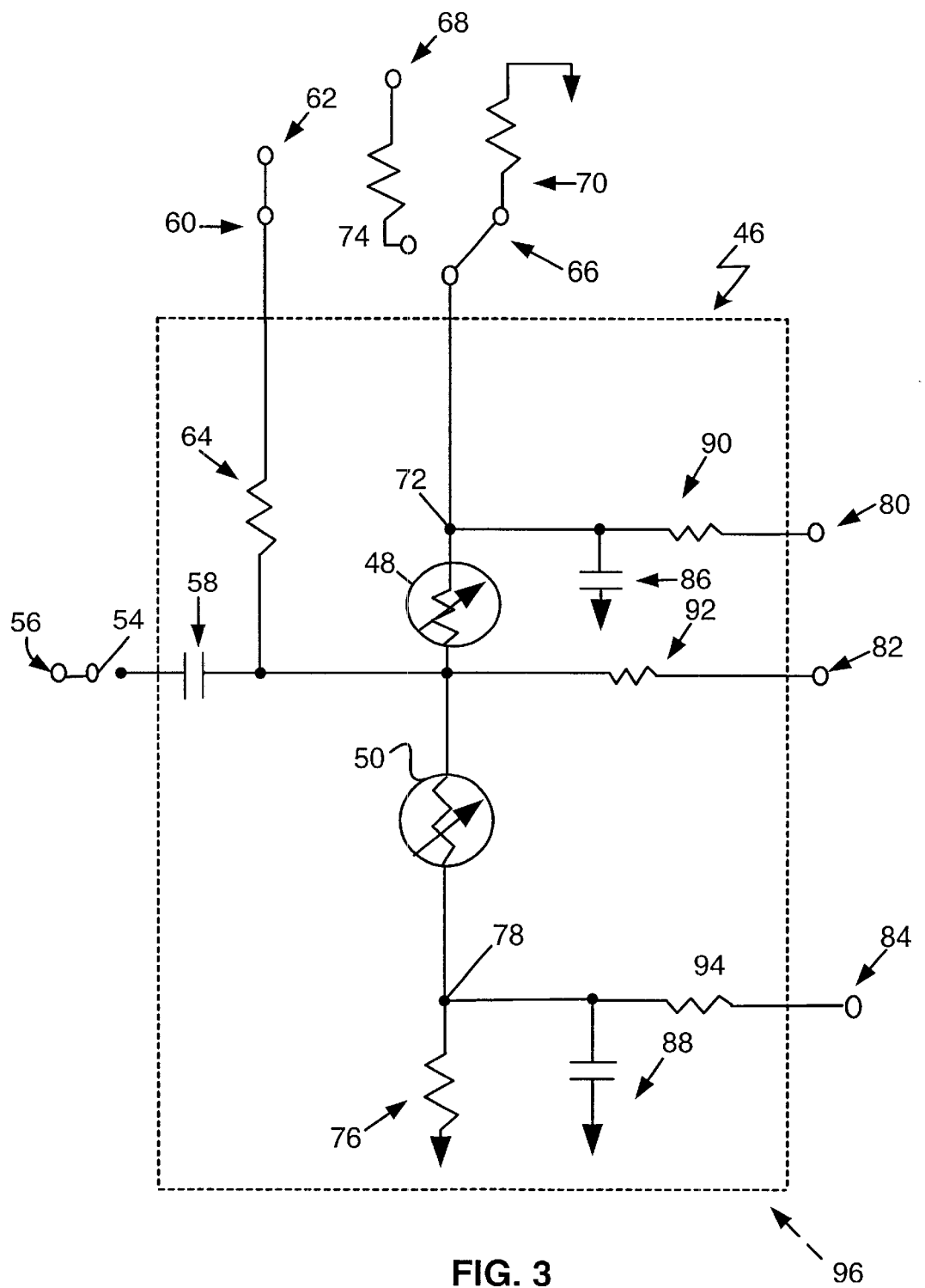
FIG. 3 is a circuit diagram of a preferred embodiment of the invention.

Referring now to FIG. 3, there is shown a preferred embodiment of the power sensing RF termination circuit 46 of the present invention. The circuit 46 comprises first and second temperature sensitive resistors 48 and 50, such as thermistors, having a first common connection 52. A first switch 54 either connects or disconnects an RF input terminal 56 to a first coupling capacitor 58, which is in turn connected to the first common connection 52. A second switch 60 either connects or disconnects a DC power reference 62 to a first dropping resistor 64, which is in turn connected to the first common connection 52. A third switch 66 connects the first temperature sensitive resistor 48 to either a DC voltage source 68 or a first current detecting resistor 70. The first temperature sensitive resistor 48 and the third switch 66 have a second common connection 72. A second dropping resistor 74 is connected to a DC voltage source 68 such that the second dropping resistor 74 is between the DC voltage source 68 and the third switch 66 when the third switch 66 is closed to apply the DC voltage source to the power sensing RF termination circuit 46. The first current detecting resistor 70 is connected to a ground reference. A second current detecting resistor 76 is connected between the second temperature resistor 50 and the ground. The second temperature sensitive resistor 50 and the second current detecting resistor 76 have a third common connection 78.

A first output terminal 80 is connected to the second common connection 72. A second output terminal 82 is connected to the first common connection 52. A third output terminal 84 is connected to the third common connection 78. A second coupling capacitor 86 is connected between the second common junction 72 and ground. A third coupling capacitor 88 is connected between the third common connection 78 and ground. First, second and third isolating resistors, 90, 92 and 94 are connected between the first output terminal 80 and the second common connection 72, between the second output terminal 82 and the first common connection 52, and between the third output terminal 84 and the third common connection 76, respectively.

Preferably, one of the temperature sensitive resistors 48, 50 has a positive temperature coefficient of resistance, and the other temperature sensitive resistor has a negative temperature coefficient of resistance; and the magnitudes of the temperature coefficients of resistance of the first and second temperature sensitive resistors 48, 50 are in the range 2000–6000 parts per million (ppm) per C°. However, the power dissipated by resistors 48, 50 can be measured even if the TCRs have the same polarity as long as the TCRs are sufficiently different.

The temperature sensitive resistors 48 and 50 have a nominal resistance value appropriate to provide the desired termination resistance for the RF circuit being terminated by the circuit 46. For example, for a 50 ohm termination, each of the first and second temperature sensitive resistors 48 and 50 has a nominal resistance value of approximately 100 ohms. As indicated above, it may be advantageous for the temperature sensitive resistor with a NTC to have a resistance on the order of 120 ohms and the temperature sensitive resistor with a PTC to have a resistance on the order of 80 ohms. The nominal resistance value of each of the first and second current detecting resistors is 10 ohms. The nominal resistance value of the first dropping resistor 64 is 500 ohms. The nominal resistance value of the second dropping resistor 74 is 300 ohms. Resistors 90, 92 and 94 illustratively have a resistance of 10 K ohms each. Preferably, the current detecting resistors should have a tolerance of 1% or less. The tolerance of the other fixed resistors is not as critical.

The circuit 46 is a power sensing RF termination which allows the user to calibrate the circuit, and thus to correct for part-to-part variation, miss match loss and output offset. A calibration of the circuit 46 is performed while the first switch 54 is disconnected from the RF input terminal 56, the second switch 60 is connected to the DC power reference 62, and the third switch 66 is connected to the first current detecting resistor 70.

The calibration of the circuit 46 is performed using measurements of the voltages at the first, second, and third output terminals 80, 82 and 84, namely, $V_1$ at the first output terminal 80, $V_2$ at the second output terminal 82, and $V_3$ at the third output terminal 84. From the voltage at the first output terminal, $V_1$, the current in the first temperature sensitive resistor 48, $I_{R1}$, can be determined: $I_{R1}=V_1/$(resistance value of the current detecting resistor 70). Similarly, from the voltage at the third output terminal, $V_3$, the current in the second temperature sensitive resistor 50, $I_{R2}$, can be determined: $I_{R2}=V_3/$(resistance value of the current detecting resistor 76). The power in the first and second temperature sensitive resistors 48 and 50, $P_{(R1+R2)}$, can also be determined: $P_{(R1+R2)}=I_{R1}(V_2-V_1)+I_{R2}(V_2-V_3)$.

In accordance with the invention, a calibration table is built over the range of power for which the termination circuit 46 is used. The calibration table correlates the ratio between the voltage drop $(V_1-V_2)$ or $(V_2-V_3)$ across one of resistors 48, 50 and the voltage drop $(V_1-V_3)$ across both resistors to the power $P_{(R1+R2)}$ absorbed by the resistors. Since resistance is directly proportional to the voltage drop across the resistors, the calibration table also correlates the ratio between the resistance value of the one of the temperature sensitive resistor 48, 50 and the sum of the resistance values of both temperature sensitive resistors 48, 50 to the power absorbed in these two temperature sensitive resistors. This DC power calibration can be done every few minutes, depending on changes in ambient temperature. The circuit 46 settles in about 20 ms.

Once the DC power calibration is done, the positions of the first, second and third switches 54, 60 and 66 are changed to allow the usage of the circuit 46 as a power sensing RF termination. Specifically, the first switch is connected to the RF input terminal 56, the second switch is disconnected from the DC power reference 62, and the third switch is connected to the second dropping resistor 74. The circuit 46 senses the RF power in the first and second temperature sensitive resistors 48 and 50 by measuring the voltages at the first, second, and third output terminals 80, 82 and 84, i.e., $V_1$, $V_2$ and $V_3$. In particular, in the case where the calibration table correlates the ratio $(V_2-V_3)/(V_1-V_3)$ to $P_{(R1+R2)}$, the values $V_1$, $V_2$ and $V_3$ are used to calculate $(V_2-V_3)/(V_1-V_3)$ and this value is used to read the RF power absorbed in the first and second temperature sensitive resistors 48, 50, i.e., $P_{(R1+R2)}$, from the calibration table.

From the measurements of $V_1$, $V_2$ and $V_3$, the resistance values of the first and second temperature sensitive resistors, 48, 50, i.e., $R_1$ and $R_2$, can also be determined and the value of the parallel combination of $R_1$ and $R_2$ can be determined. To the extent that this value departs from the desired termination load resistance, a correction can be made in the RF power value read from the calibration table.

All of the components of the present invention are formed using standard thick film techniques. A hybrid circuit may be constructed that includes the first, second and third switches, 54, 60 and 66, the second dropping resistor 74, and the first current detecting resistor 70. The external circuit may also be achieved with a printed circuit board that holds both the sensor package 94 and other components.

Thus, there is provided by the present invention, an RF power sensing circuit which can be easily calibrated, thus allowing the user to correct for part-to-part variation, miss match loss and output offset. Although nominal values for the various components of the circuit 46 have been given as illustrative, it should be understood that these values can be varied. For example, the values of the dropping resistors may be changed to adjust the supply voltage range.

What is claimed is:

1. A power sensing RF termination comprising:
   first and second temperature sensitive resistors connected at a first common junction;
   a switching means for connecting either an RF input or a DC power reference to the first common junction;
   a first switch for connecting either a DC voltage source or a first resistor to the first temperature sensitive resistor, the first switch and the first temperature sensitive resistor connected at a second common junction; and
   a second resistor connected with the second temperature sensitive resistor at a third common junction.

2. The power sensing RF termination in accordance to claim 1 wherein the first temperature sensitive resistor has a positive temperature coefficient of resistance and the second temperature sensitive resistor has a negative temperature coefficient of resistance.

3. The power sensing RF termination in accordance to claim 2 wherein the first and second temperature sensitive resistors have substantially the same temperature coefficient of resistance and substantially the same nominal resistance at room temperature.

4. The power sensing RF termination in accordance to claim 1, wherein a third resistor is connected in series to the DC voltage source such that the third resistor is connected between the DC voltage source and the first switch when the first switch is closed to apply the DC voltage source to the power sensing RF termination.

5. The power sensing RF termination in accordance to claim 1, wherein the switching means comprises a second switch which either connects or disconnects the RF input to a first capacitor, said capacitor being connected to the first common junction.

6. The power sensing RF termination in accordance to claim 5, wherein the switching means further comprises a third switch which either connects or disconnects the DC power reference to a fourth resistor, said fourth resistor being connected to the first common junction.

7. The power sensing RF termination in accordance to claim 1, wherein a second capacitor is connected between the second common junction and a ground reference and wherein a third capacitor is connected between the third common junction and a ground reference.

8. The power sensing RF termination in accordance to claim 1 wherein the first and second temperature sensitive resistors are seen by the RF input to be connected in parallel.

9. The power sensing RF termination in accordance to claim 1, wherein a fifth resistor is connected between the second common junction and a first output terminal, a sixth resistor is connected between the first common junction and a second output terminal, and a seventh resistor is connected between the third common junction and a third output terminal.

10. A power sensing RF termination comprising:

first and second temperature sensitive resistors connected at a first common junction;

a first switch for connecting either an RF input or a DC power reference to the first common junction;

a second switch for connecting either a DC voltage source or a first resistor to the first temperature sensitive resistor, the first switch and the first temperature sensitive resistor connected at a second common junction; and a second resistor connected with the second temperature sensitive resistor at a third common junction.

* * * * *